United States Patent
Chen et al.

(10) Patent No.: US 8,585,109 B2
(45) Date of Patent: Nov. 19, 2013

(54) GRIPPER WITH CARBON NANOTUBE FILM STRUCTURE

(75) Inventors: Lu-Zhuo Chen, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 208 days.

(21) Appl. No.: 12/986,265

(22) Filed: Jan. 7, 2011

(65) Prior Publication Data

US 2012/0049552 A1 Mar. 1, 2012

(30) Foreign Application Priority Data

Aug. 25, 2010 (CN) .................. 2010 10 2625697

(51) Int. Cl.
*B25J 15/02* (2006.01)
*B66C 1/44* (2006.01)
*H01L 41/047* (2006.01)

(52) U.S. Cl.
USPC ........................... 294/86.4; 310/363

(58) Field of Classification Search
USPC .............. 294/86.4, 103.1, 902; 310/363–366, 310/800
See application file for complete search history.

(56) References Cited

U.S. PATENT DOCUMENTS

| | | | |
|---|---|---|---|
| 4,400,642 A * | 8/1983 | Kiraly | 428/292.1 |
| 4,610,475 A * | 9/1986 | Heiserman | 294/86.4 |
| 8,026,773 B2 * | 9/2011 | Zhu et al. | 333/32 |
| 8,421,315 B2 * | 4/2013 | Chen et al. | 310/363 |
| 2005/0168113 A1* | 8/2005 | Hirai et al. | 310/800 |
| 2008/0185936 A1* | 8/2008 | Panchapakesan et al. | 310/306 |
| 2008/0280137 A1* | 11/2008 | Ajayan et al. | 428/375 |
| 2011/0094217 A1* | 4/2011 | Chen et al. | 60/528 |
| 2011/0234053 A1* | 9/2011 | Chen et al. | 428/297.4 |

* cited by examiner

*Primary Examiner* — Paul T Chin

(74) *Attorney, Agent, or Firm* — Altis & Wispro Law Group, Inc.

(57) ABSTRACT

A gripper includes a support and a plurality of gripping arms fixed on the support. One of the plurality of gripping arms includes a base and a carbon nanotube film structure to define a conductive circuit. The conductive circuit receives current to heat the base and the carbon nanotube film structure to actuate the gripper for gripping an object.

22 Claims, 16 Drawing Sheets

GRIPPER WITH CARBON NANOTUBE FILM STRUCTURE

BACKGROUND

1. Technical Field

The present disclosure relates to a gripper with a carbon nanotube film structure that receives current to actuate the gripper for gripping an object.

2. Description of Related Art

New devices and components for a wide variety of utility applications may require new packaging and deployment systems, such as object engagement and displacement mechanisms employed in medical instruments and semiconductor processing robotic components. Currently technology for controlling these types of devices usually falls into actuator categories that could be unattractive and impractical to present needs.

For example, a DC motor-controlled gripper requires a second motor as an auxiliary (fail-safe mode) unit to ensure that the gripper will return to its open position. Moreover, it cannot be actuated in the event of a power loss, and has a relatively large number of parts, size, and weight. Solenoid actuators are essentially on/off devices, so that they have no position control capability, dissipate substantial heat, and are relatively large in size and weight. Thermal switch actuators and piezoelectric devices are also position control-limited (too small a range of motion) and dissipate a substantial amount of heat. In addition, each of these types of actuator subsystems requires a multi-component mechanical interface, such as a gear train and associated linkage system between the drive unit and the element(s) being deflected or displaced.

Thus, there remains a need for providing a new gripper which can be utilized for gripping different components and materials.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
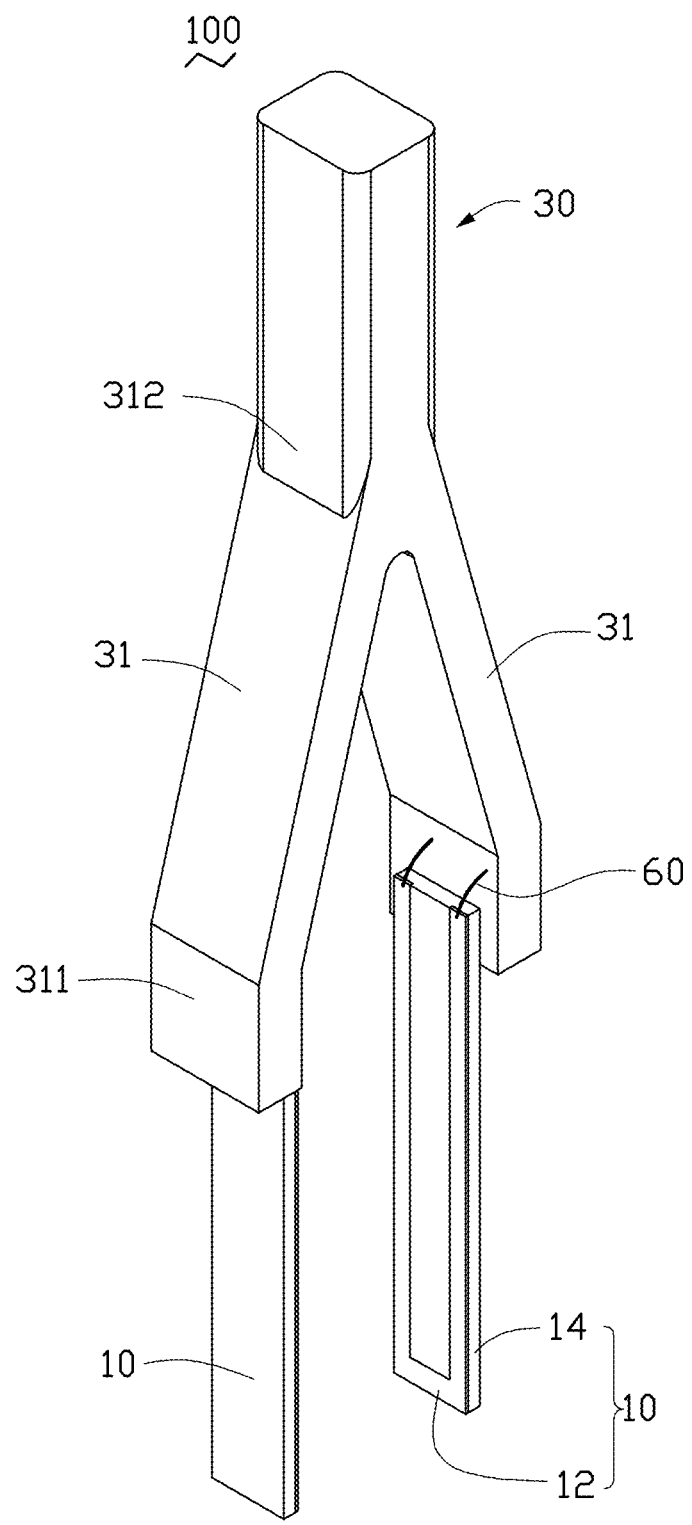
FIG. 1 is a schematic view of one embodiment of a gripper.

According to an embodiment, a gripper 100 as illustrated in FIG. 1 comprises a support 30, two gripping arms 10, and a plurality of conducting wires 60. The support 30 comprises two supportive arms 31. Each of the two supportive arms 31 comprises a first side 311 and a second side 312. The first sides 311 of the two supportive arms 31 are assembled opposing each other. The second sides 312 of the two supportive arms 31 are in contact with each other by integration or coherence. Thus, the support 30 is assembled as a Y-type support 30. The two gripping arms 10 are respectively fixed on the first sides 311 of the two supportive arms 31 by coherence opposing each other. The conducting wires 60 fixed on the two supportive arms 31 are electrically connected to the two gripping arms 10.

The two supportive arms 31 can be metal, plastic, wood, glass, or any combination thereof. If the two supportive arms 31 are metal, insulating material is coated on the two supportive arms 31 to avoid a short between the two gripping arms 10. In the embodiment, the two supportive arms 31 are plastic bars, and each of the two supportive arms 31 is about 10 centimeters (cm) in length and about 1 cm in width.

Figure 2:
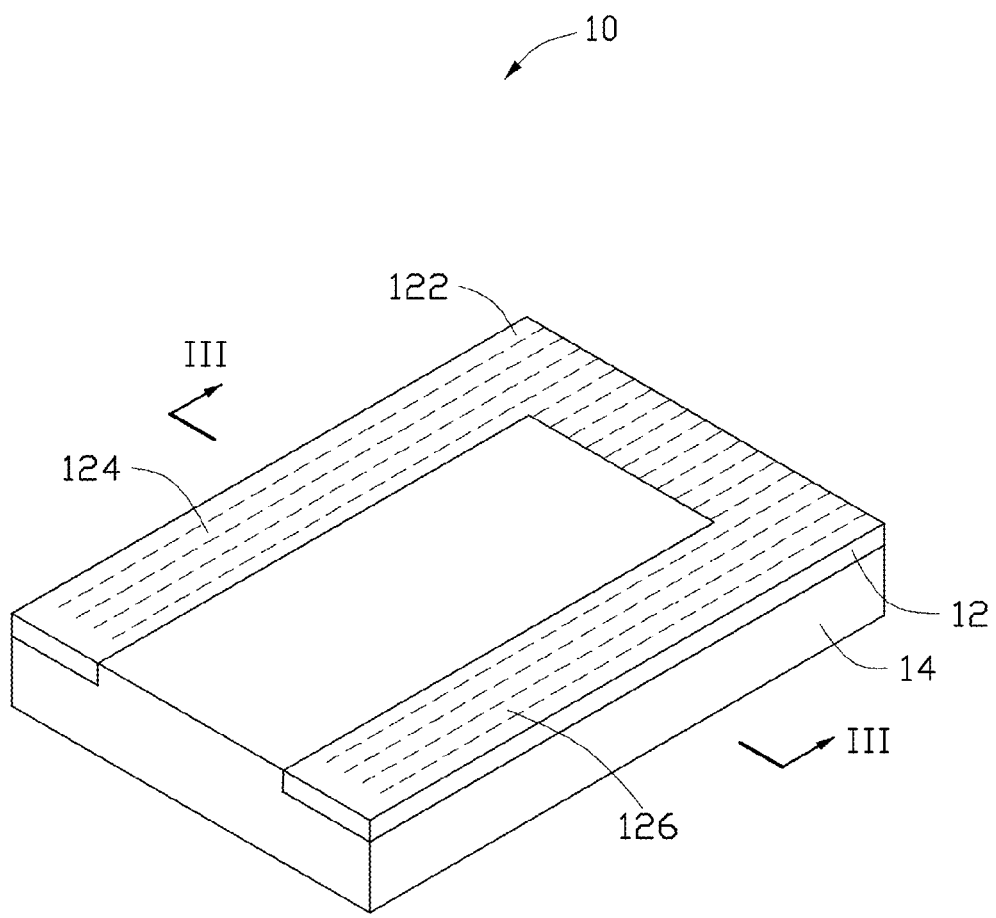
FIG. 2 is a schematic view of one embodiment of a gripping arm of the gripper shown in FIG. 1.
Figure 3:
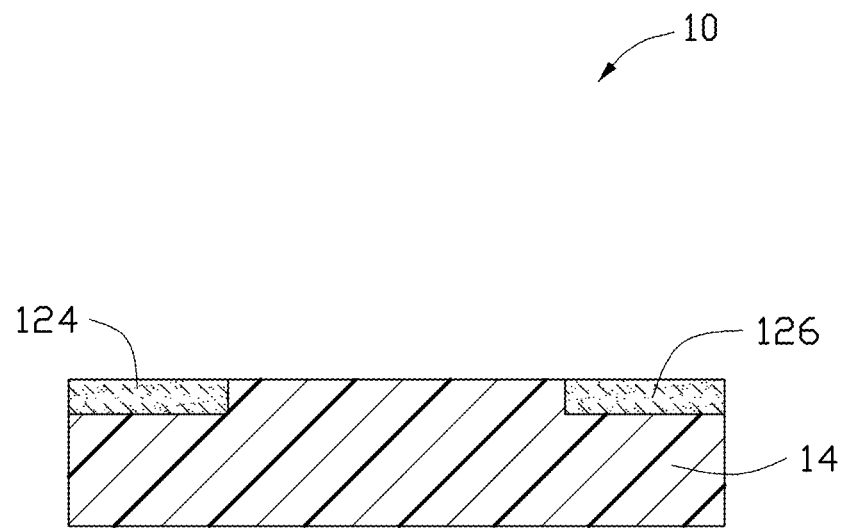
FIG. 3 is a cross-section of the gripping arm shown in FIG. 2 taken along line III-III.

FIG. 2 is a schematic view of an embodiment of one of the two gripping arms 10 shown in FIG. 1. FIG. 3 is a cross-section of the gripping arm 10 shown in FIG. 2 taken along line III-III. As shown in FIGS. 2 and 3, the gripping arm 10 comprises a carbon nanotube film structure 12 and a base 14. The carbon nanotube film structure 12 can be located on the base 14 or received in the base 14, and a thickness ratio of the carbon nanotube film structure to the base is in a range from about 1:5 to about 1:200. In the embodiment, the carbon nanotube film structure 12 is half buried in the base 14.

The carbon nanotube film structure 12 and the base 14 have different coefficients of thermal expansion (CTE). More specifically, the CTE of the carbon nanotube film structure 12 is smaller than the CTE of the base 14. Thus, when the gripping arm 10 receives current by the conducting wires 60, the carbon nanotube film structure 12 and the base 14 are simultaneously heated. After heating, expansion of the base 14 will be greater than expansion of the carbon nanotube film structure 12, such that the gripping arm 10 will bend toward the carbon nanotube film structure 12. Accordingly, the gripper 100 grips an object in response to the bend of the gripping arm 10.

The base 14 composed of insulating material can be circular, rectangular, or any shape. The insulating material of the base can be silicone rubber, polymethyl methacrylate, polyurethane, epoxy resin, poly ethyl acrylate, poly butyl acrylate, polystyrene, polybutadiene, polyacrylonitrile, polyaniline, polypyrrole, polythiophene and any combination thereof. In the embodiment, the base 14 is a silicone rubber sheet which is about 6 cm in length, about 1 cm in width, and about 1 millimeters (mm) in thickness.

Referring to FIGS. 2 and 3, the carbon nanotube film structure 12 comprises a first electric part 124 and a second electric part 126. Furthermore, referring to FIG. 4, the carbon nanotube film structure 12 comprises a connection part 125. The first electric part 124, the second electric part 126, and the connection part 125 can be rectangular or stria. The first electric part 124 and the second electric part 126 are located on the base 14 at a set interval. The connection part 125 located on the base 14 is distant from the first side 311 of the supportive arm 31 and in contact with the first electric part 124 and the second electric part 126 to define a U-type conductive circuit. One side of the first electric part 124 distant from the connection part 125 is electrically connected to one of the conducting wires 60. Likewise one side of the second electric part 126 distant from the connection part 125 is electrically connected to another one of the conducting wires 60. Thus, the current can pass through the first electric part 124, the connection part 125, and the second electric part 126 to simultaneously heat the carbon nanotube film structure 12 and the base 14.

Figure 4:
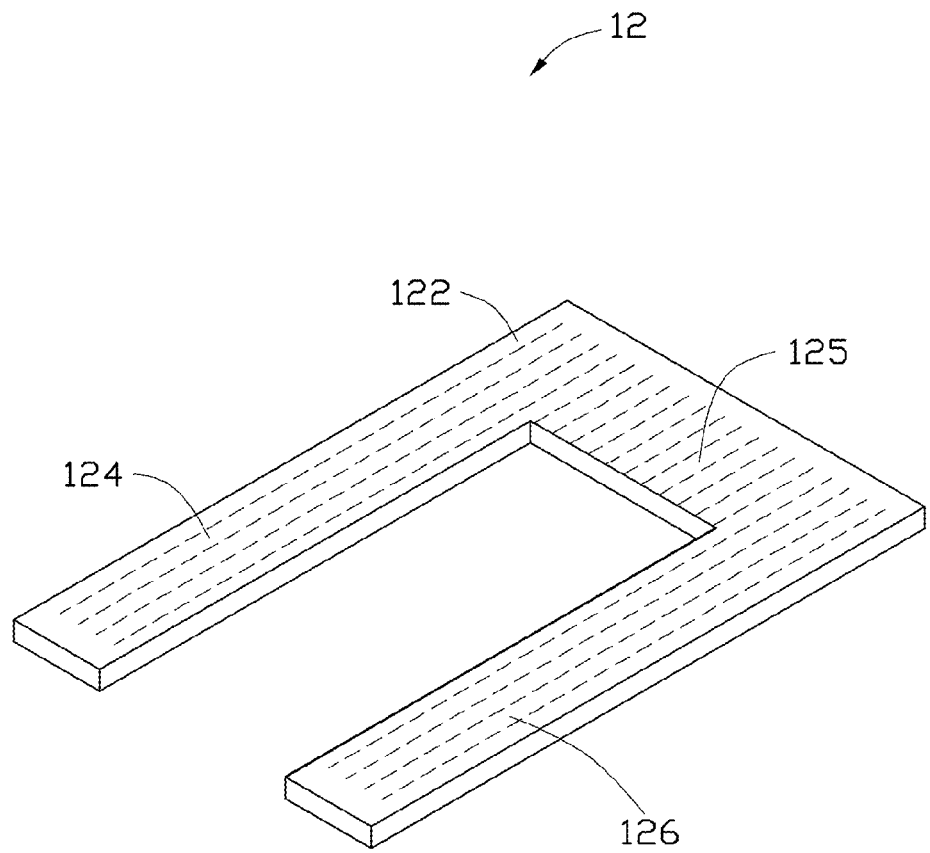
FIG. 4 is a schematic view of a carbon nanotube film structure of the gripping arm shown in FIG. 2.

In the embodiment, the carbon nanotube film structure 12 is about 6 cm in length, about 1 cm in width, and about 100 micrometers (um) in thickness. Each of the first electric part 124 and the second electric part 126 is a rectangular sheet which is about 5 cm in length and about 0.4 cm in width. The set interval between the first electric part 124 and the second electric part 126 is about 0.2 cm. The connection part 125 is a square sheet which is about 1 cm in every side length Furthermore, the carbon nanotube film structure 12 can be composed of a carbon nanotube film or a plurality of laminated carbon nanotube films. The carbon nanotube film including a plurality of carbon nanotubes 122 can be a drawn carbon nanotube film, a pressed carbon nanotube film, or a flocculated carbon nanotube film. As shown in FIG. 4, the carbon nanotubes 122 of the first electric part 124, the second electric part 126, and the connection part 125 are substantially oriented along the same direction.

Figure 5:
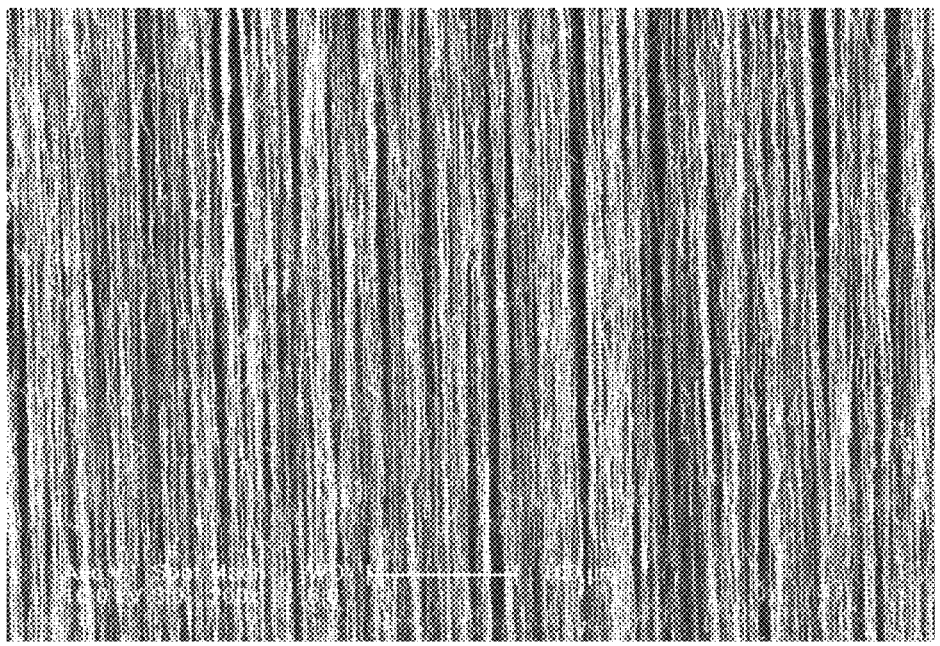
FIG. 5 shows a Scanning Electron Microscope (SEM) image of a drawn carbon nanotube film comprising a plurality of carbon nanotubes.
Figure 6:
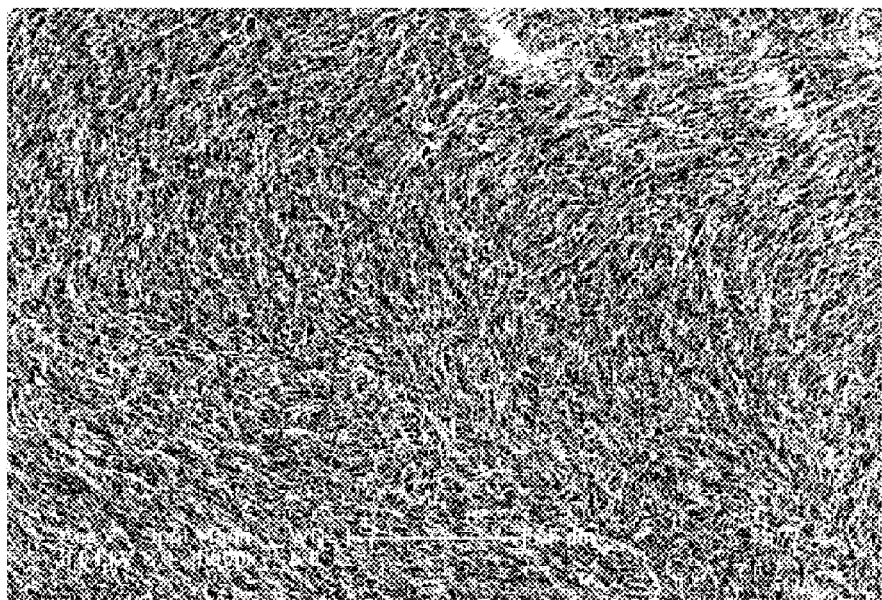
FIG. 6 shows an SEM image of a pressed carbon nanotube film comprising a plurality of carbon nanotubes.
Figure 7:
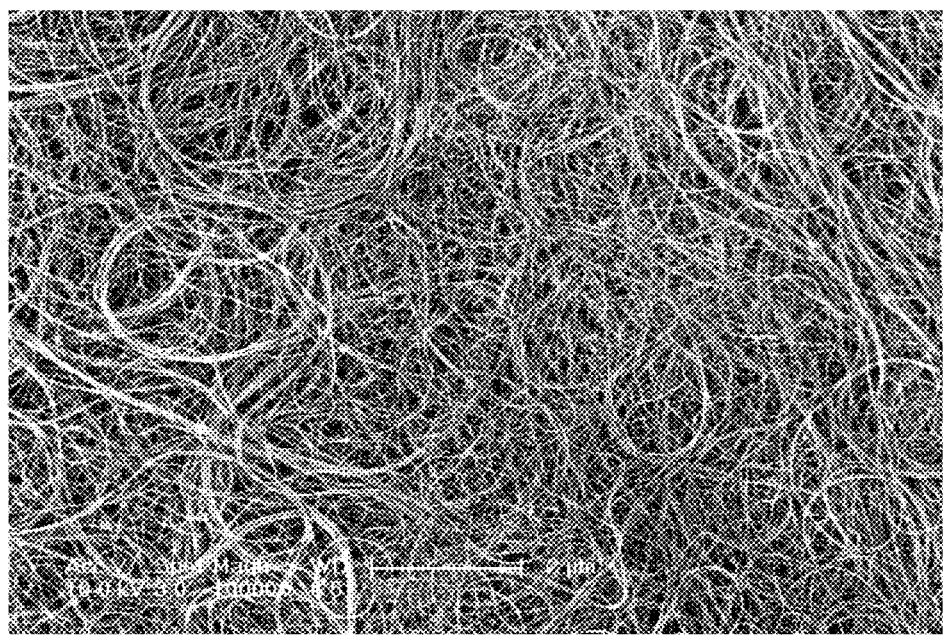
FIG. 7 shows an SEM image of a flocculated carbon nanotube film comprising a plurality of carbon nanotubes.

FIGS. 5, 6, and 7 respectively show SEM images of the drawn carbon nanotube film, the pressed carbon nanotube film, and the flocculated carbon nanotube film. As shown in FIG. 5, the drawn carbon nanotube film can have a thickness of about 0.5 nanometers (nm) to about 100 um. The drawn carbon nanotube film includes a plurality of carbon nanotubes that can be arranged substantially parallel to a surface of the drawn carbon nanotube film. The carbon nanotubes can be single-walled carbon nanotubes, double-walled carbon nanotubes, multi-walled carbon nanotubes, or combinations thereof. The diameter of the carbon nanotubes can be in the range from about 0.5 nm to about 50 nm. The height of the carbon nanotubes can be in the range from about 50 nm to about 5 mm.

A large number of the carbon nanotubes in the drawn carbon nanotube film can be oriented along a preferred orientation, meaning that a large number of the carbon nanotubes in the drawn carbon nanotube film are arranged substantially along the same direction. An end of one carbon nanotube is joined to another end of an adjacent carbon nanotube arranged substantially along the same direction, by van der Waals attractive force. More specifically, the drawn carbon nanotube film includes a plurality of successively oriented carbon nanotube segments joined end-to-end by van der Waals attractive force therebetween. Each carbon nanotube segment includes a plurality of carbon nanotubes substantially parallel to each other, and joined by van der Waals attractive force therebetween. The carbon nanotube segments can vary in width, thickness, uniformity, and shape.

A small number of the carbon nanotubes are randomly arranged in the drawn carbon nanotube film, and has a small if not negligible effect on the larger number of the carbon nanotubes in the drawn carbon nanotube film arranged substantially along the same direction.

The carbon nanotube film is capable of forming a free-standing structure. The term "free-standing structure" can be defined as a structure that does not have to be supported by a substrate. For example, a free-standing structure can sustain the weight of itself when it is hoisted by a portion thereof without any significant damage to its structural integrity. The free-standing structure of the drawn carbon nanotube film is realized by the successive segments joined end to end by van der Waals attractive force.

Understandably, some variation can occur in the orientation of the carbon nanotubes in the drawn carbon nanotube film. Microscopically, the carbon nanotubes oriented substantially along the same direction may not be perfectly aligned in a straight line, and some curve portions may exist. Furthermore, it can be understood that some carbon nanotubes are located substantially side by side and oriented along the same direction and in contact with each other.

Referring to FIG. 6, the carbon nanotubes in the pressed carbon nanotube film can be arranged along a same direction or arranged along different directions. The carbon nanotubes in the pressed carbon nanotube film can rest upon each other. The adjacent carbon nanotubes are combined and attracted to each other by van der Waals attractive force, and can form a free-standing structure. An angle between a primary alignment direction of the carbon nanotubes and a surface of the pressed carbon nanotube film can be in an approximate range from 0 degrees to approximately 15 degrees. The pressed carbon nanotube film can be formed by pressing a carbon nanotube array. The angle is closely related to pressure applied to the carbon nanotube array. The greater the pressure, the smaller the angle.

The carbon nanotubes in the carbon nanotube film can be substantially parallel to the surface of the carbon nanotube film when the angle is 0 degrees. A length and a width of the carbon nanotube film can be set as desired. The pressed carbon nanotube film can include a plurality of carbon nanotubes substantially aligned along one or more directions. The pressed carbon nanotube film can be obtained by pressing the carbon nanotube array with a pressure head. Alternatively, the shape of the pressure head and the pressing direction can determine the direction of the carbon nanotubes arranged therein.

More specifically, in one embodiment, when a planar pressure head is used to press the carbon nanotube array along the direction substantially perpendicular to a substrate. A plurality of carbon nanotubes pressed by the planar pressure head may be sloped in many directions. In another embodiment, when a roller-shaped pressure head is used to press the carbon nanotube array along a certain direction, the pressed carbon nanotube film having a plurality of carbon nanotubes substantially aligned along the certain direction can be obtained. In the other embodiment, when the roller-shaped pressure head is used to press the carbon nanotube array along different directions, the pressed carbon nanotube film having a plurality of carbon nanotubes substantially aligned along different directions can be obtained.

Referring to FIG. 7, the flocculated carbon nanotube film can include a plurality of long, curved, disordered carbon nanotubes entangled with each other and can form a free-standing structure. Further, the flocculated carbon nanotube film can be isotropic. The carbon nanotubes can be substantially uniformly dispersed in the carbon nanotube film. The adjacent carbon nanotubes are acted upon by the van der Waals attractive force therebetween, thereby forming an entangled structure.

In other embodiments, the flocculated carbon nanotube film is very porous. Furthermore, due to the carbon nanotubes in the carbon nanotube film being entangled with each other, the carbon nanotubes employing the flocculated carbon nanotube film has excellent durability, and can be fashioned into desired shapes with a low risk to the integrity of carbon nanotube structure. The flocculated carbon nanotube film, in some embodiments, will not require the use of structural support due to the carbon nanotubes being entangled and adhered together by van der Waals attractive force therebetween. Furthermore, the flocculated carbon nanotube film can have a thickness of about 0.5 nanometers to about 100 microns.

Figure 8:
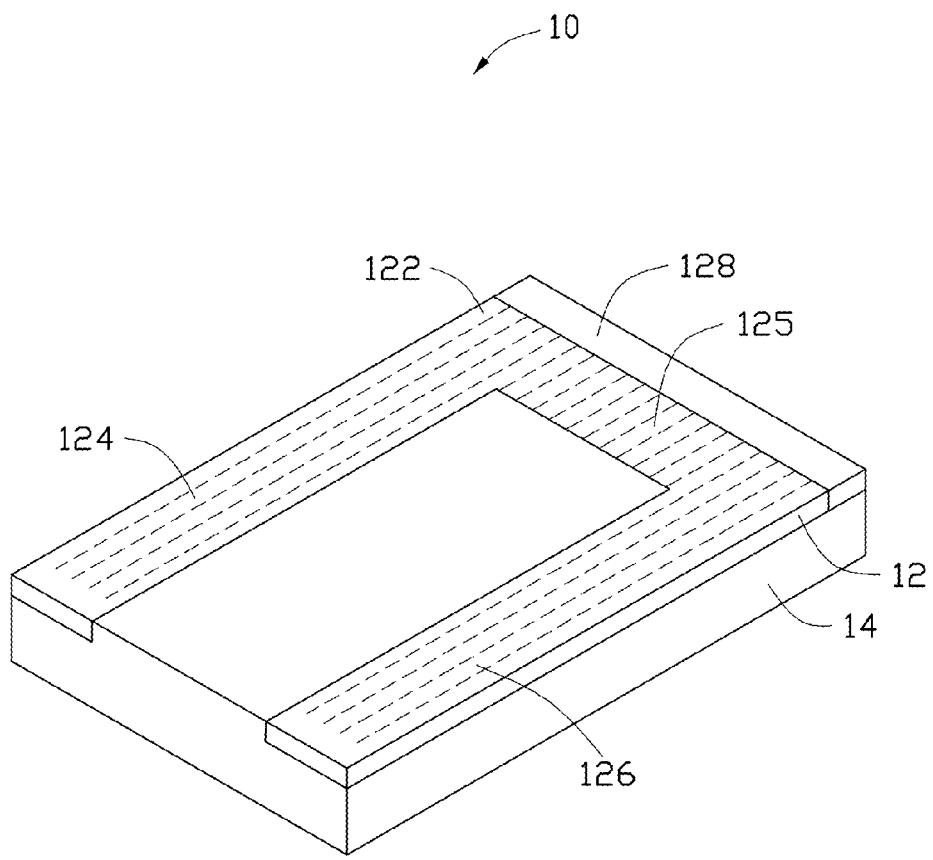
FIGS. 8 and 9 are schematic views of embodiments of the gripping arm of the gripper shown in FIG. 1.

FIG. 8 is a schematic view of another embodiment of one of the gripping arms 10 shown in FIG. 1. As shown in FIG. 8, the gripping arm 10 comprises a carbon nanotube film structure 12 and a base 14. The carbon nanotube film structure 12 comprises a first electric part 124, a second electric part 126, a connection part 125, and a conductive layer 128. The conductive layer 128 adjoins the connection part 125 to enhance conductivity of the conductive circuit of the gripping arm 10, such that the carbon nanotube film structure 12 and the base 14 can be heated faster. The conductive layer 128 can be gold, platinum, palladium, silver, copper, iron, nickel, or any metal with greater electric conductivity. In the embodiment, the conductive layer 128 is composed of silver colloid. The carbon nanotubes 122 of the first electric part 124, the second electric part 126 and the connection part 125 are substantially oriented along the same direction.

Figure 9:
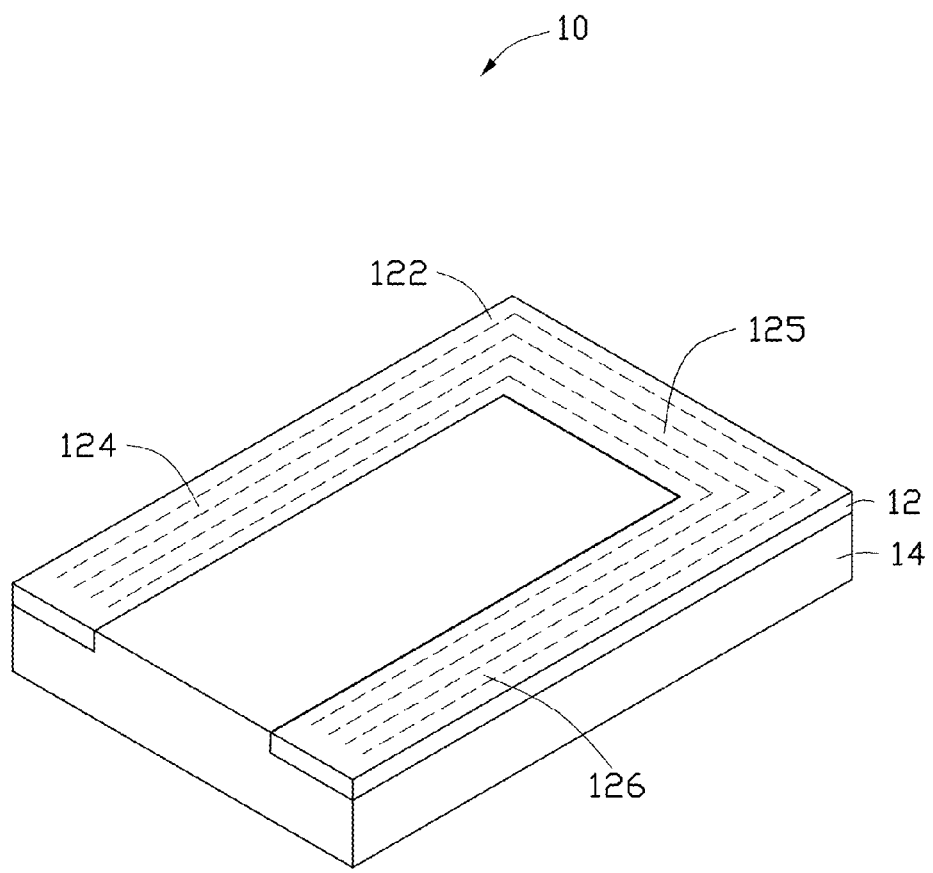

FIG. 9 is a schematic view of the other embodiment of one of the gripping arms 10 shown in FIG. 1. As shown in FIG. 9, the gripping arm 10 comprises a carbon nanotube film structure 12 and a base 14. The carbon nanotube film structure 12 comprises a first electric part 124, a second electric part 126, and a connection part 125. In the embodiment, the carbon nanotubes 122 of the first electric part 124 and the second electric part 126 are substantially oriented along the same direction. The carbon nanotubes 122 of the connection part 125 are substantially oriented along a direction substantially perpendicular to the direction that the carbon nanotubes 122 of the first electric part 124 and the second electric part 126 are oriented.

Figure 10:
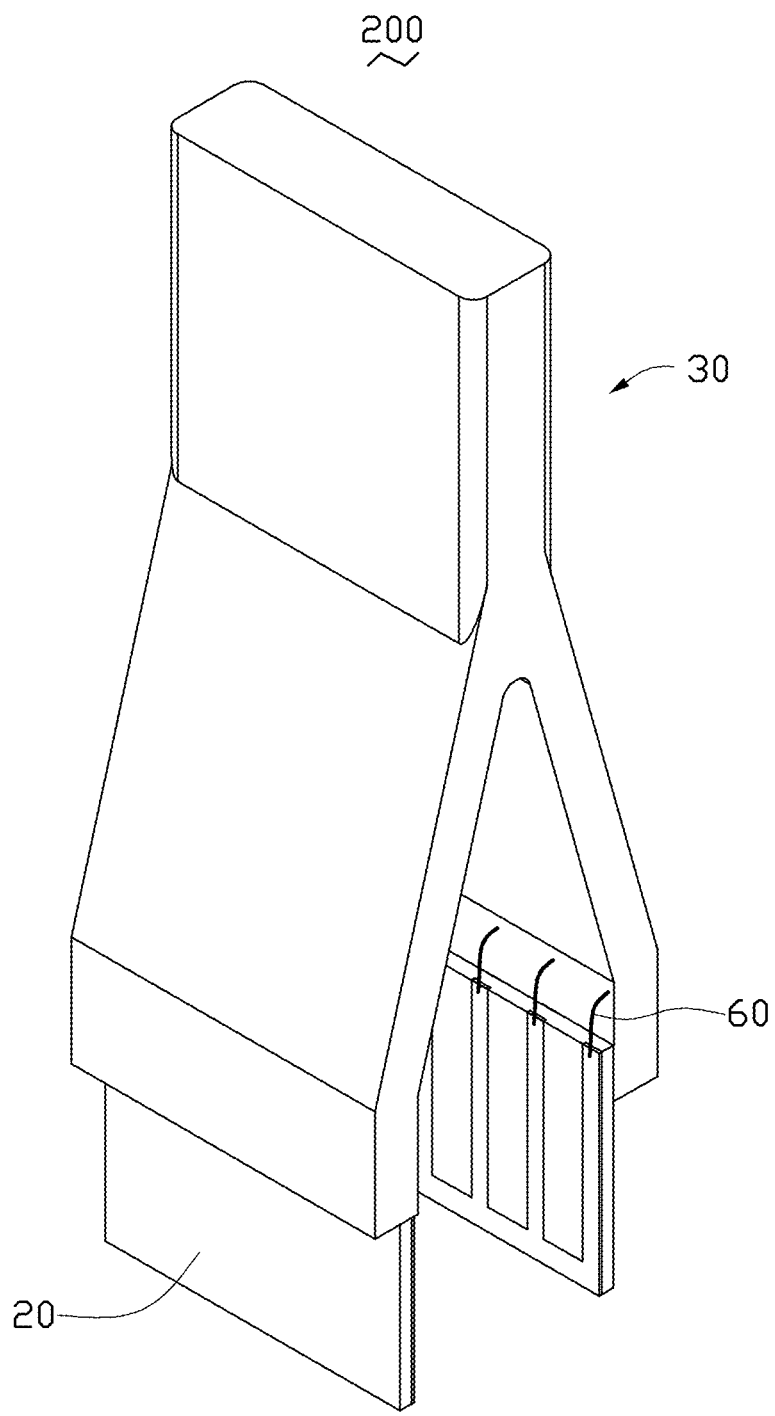
FIG. 10 is a schematic view of one embodiment of a gripper.
Figure 11:
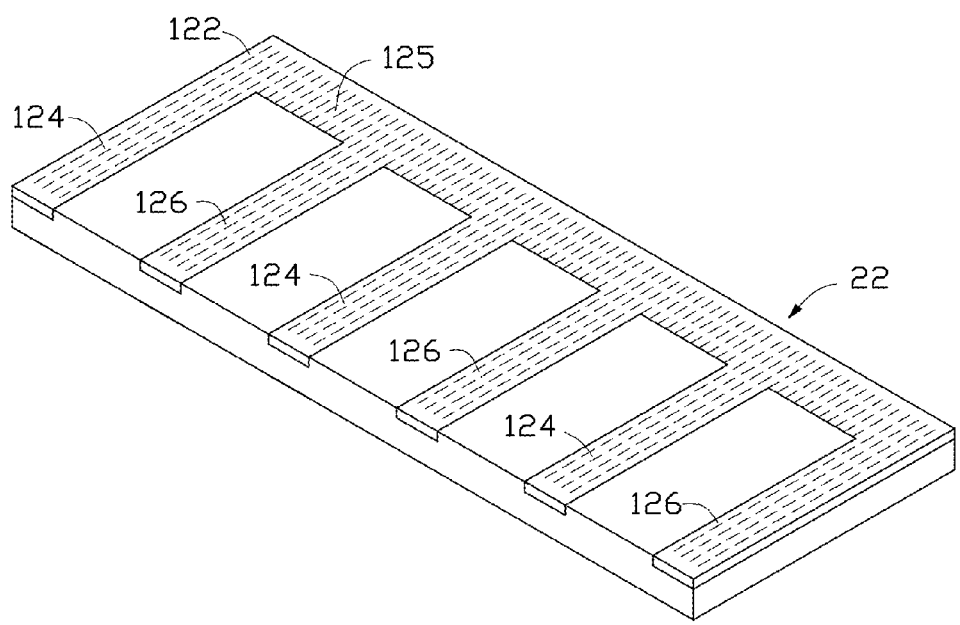
FIG. 11 is a schematic view of one embodiment of a gripping arm of the gripper shown in FIG. 10.

According to another embodiment, a gripper 200 as illustrated in FIG. 10 comprises a support 30, two gripping arms 20, and a plurality of conducting wires 60. FIG. 11 is a schematic view of an embodiment of one of the gripping arms 20 shown in FIG. 10. As shown in FIG. 11, the gripping arm 20 comprises a carbon nanotube film structure 22 and a base. The carbon nanotube film structure 22 comprises a plurality of first electric parts 124, a plurality of second electric parts 126 and a connection part 125. The first electric part 124, the second electric part 126 and the connection part 125 can be rectangular or stria. The plurality of first electric parts 124 and the plurality of second electric parts 126 are located on the base and interlaced at a set interval. The connection part 125 located on the base is in contact with the first electric parts 124 and the corresponding second electric parts 126 to define a conductive circuit. One side of each of the plurality of first electric parts 124 distant from the connection part 125 is electrically connected to one of the conducting wires 60. Likewise one side of each of the plurality of second electric parts 126 distant from the connection part 125 is electrically connected to another one of the conducting wires 60. Thus, the current can pass through the first electric part 124, the connection part 125, and the second electric part 126 to simultaneously heat the carbon nanotube film structure 12 and the base.

Figure 12:
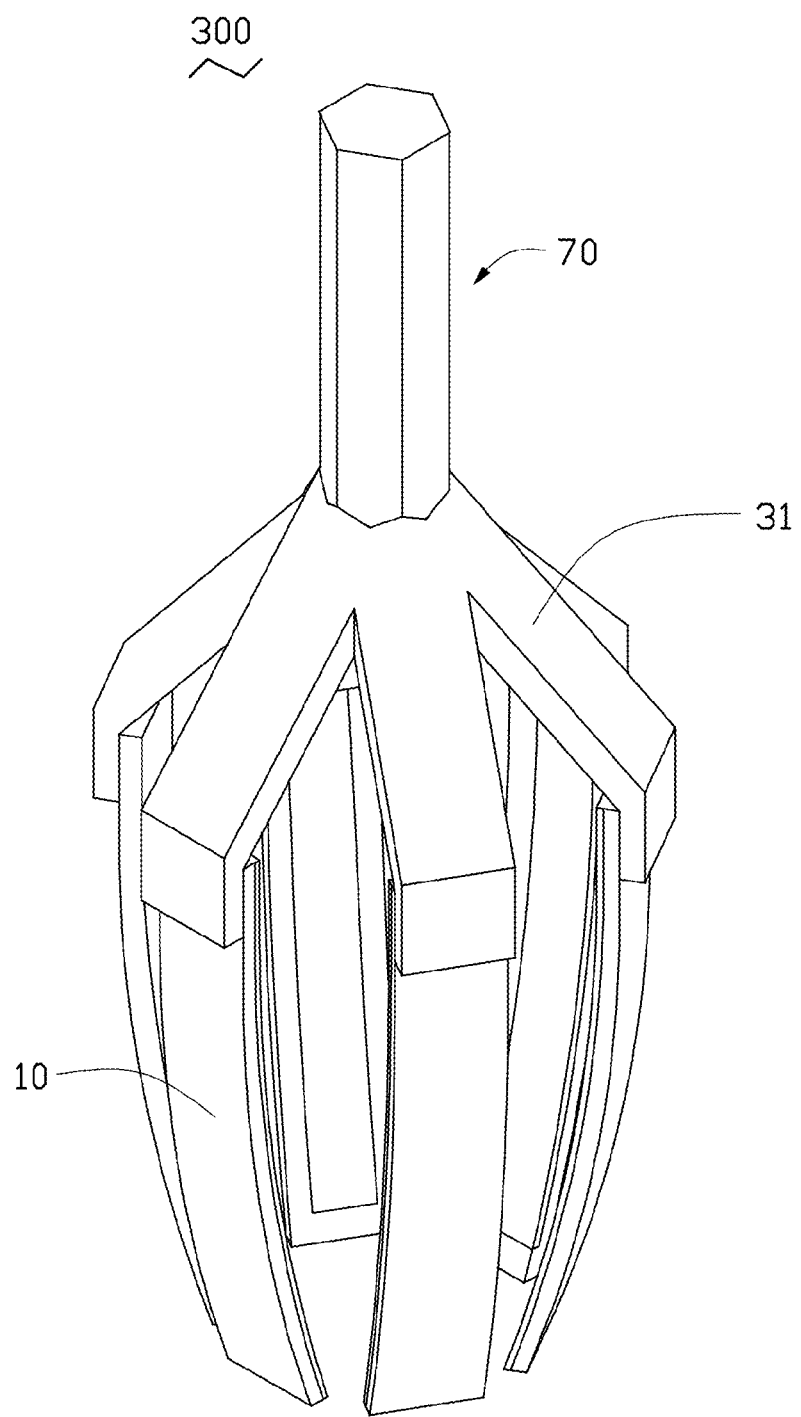
FIG. 12 is a schematic view of one embodiment of a gripper.

According to still another embodiment, a gripper 300 as illustrated in FIG. 12 comprises a support 70 and a plurality of gripping arms 10. The support 70 comprises a plurality of supportive arms 31 corresponding to the plurality of gripping arms 10. The plurality of supportive arms 31 are in contact with each other by integration or coherence in one side. The plurality of gripping arms 10 are respectively fixed on the plurality of supportive arms 31 by coherence. The conduction wires 60 fixed on the plurality of supportive arms 31 are electrically connected to the plurality of gripping arms 10. One of the gripping arms 10 of the gripper 300 is shown as FIGS. 2, 8, and 10.

Figure 13:
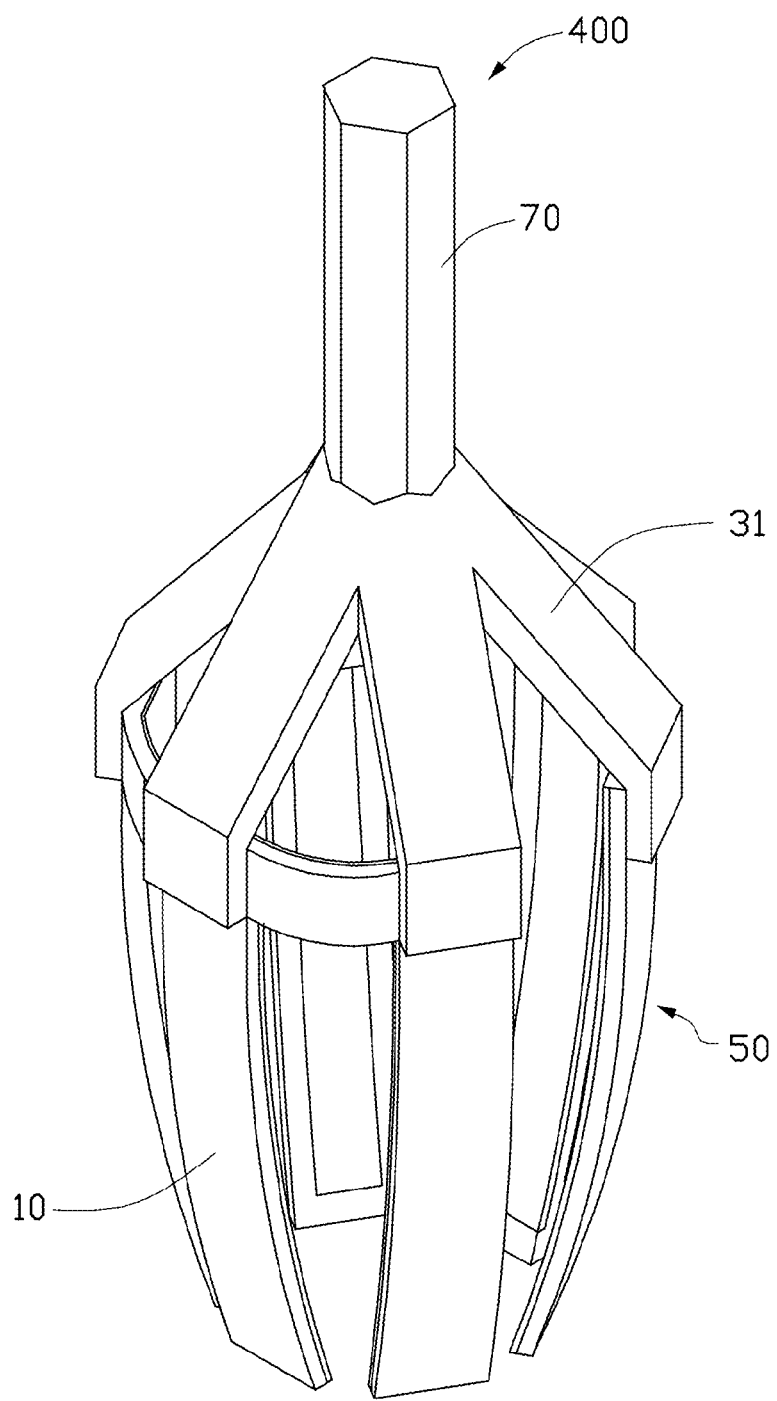
FIG. 13 is a schematic view of one embodiment of a gripper.

According to still yet another embodiment, a gripper 400 as illustrated in FIG. 13 comprises a support 70 and an integrated actuator 50. The integrated actuator 50 is composed of a plurality of gripping arms 10.

Figure 14:
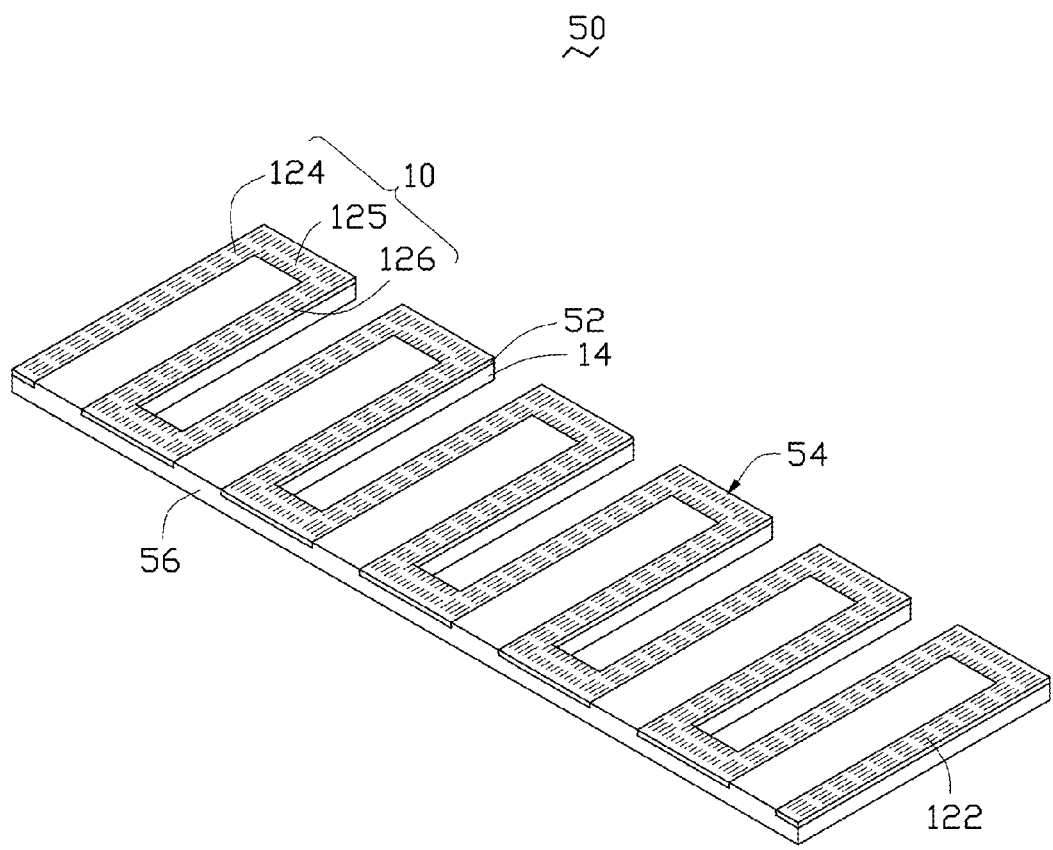
FIG. 14 is a schematic view of one embodiment of an integrated actuator of the gripper shown in FIG. 13.

FIG. 14 is a schematic view of an embodiment of the integrated actuator 50 shown in FIG. 13. As shown in FIG. 14, the integrated actuator 50 comprises a carbon nanotube film structure 52, a base 14, a first side 54, and a second side 56. The carbon nanotube film structure 52 comprises a plurality of first electric parts 124, a plurality of second electric parts 126, and a plurality of connection parts 125. The first electric part 124, the second electric part 126 and the connection part 125 can be rectangular or stria. The plurality of first electric parts 124 and the plurality of second electric parts 126 are located on the base and interlaced at a set interval. Each of the plurality of connection parts 125 located on the base is in contact with one of the first electric parts 124 and one of the corresponding second electric parts 126 to define a conductive circuit.

More specifically, one of the first electric parts 124 and one of the second electric parts 126 are electrically connected to one of the connection parts 125 by the first side 54 to define a gripping arm 10. In the embodiment, there are six first electric parts 124 and six second electric parts 126 to form six gripping arms 10. The gripping arms 10 are in contact with each other by the second side 56 to form the integrated actuator 50.

Figure 15:
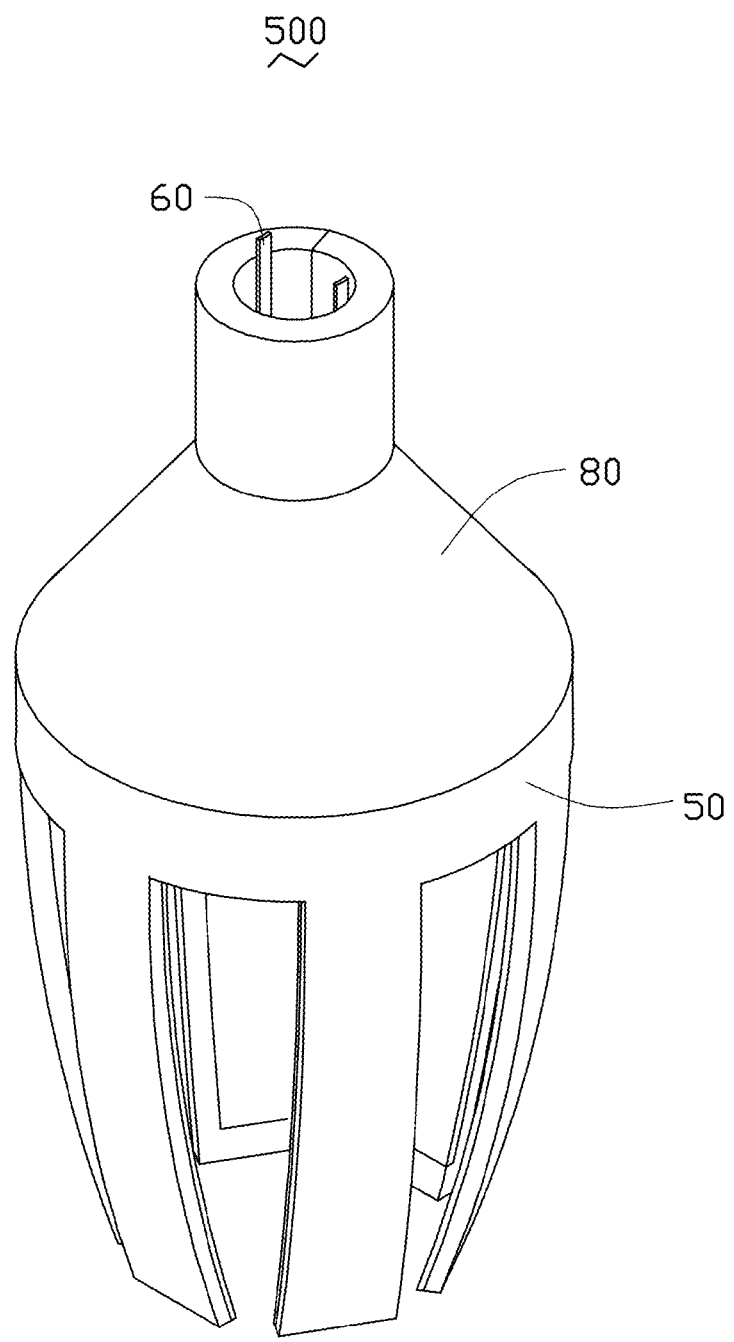
FIG. 15 is a schematic view of one embodiment of a gripper.

According to an embodiment, a gripper 500 as illustrated in FIG. 15 comprises a support 80 and an integrated actuator 50. The integrated actuator 50 is composed of a plurality of gripping arms 10.

Figure 16:
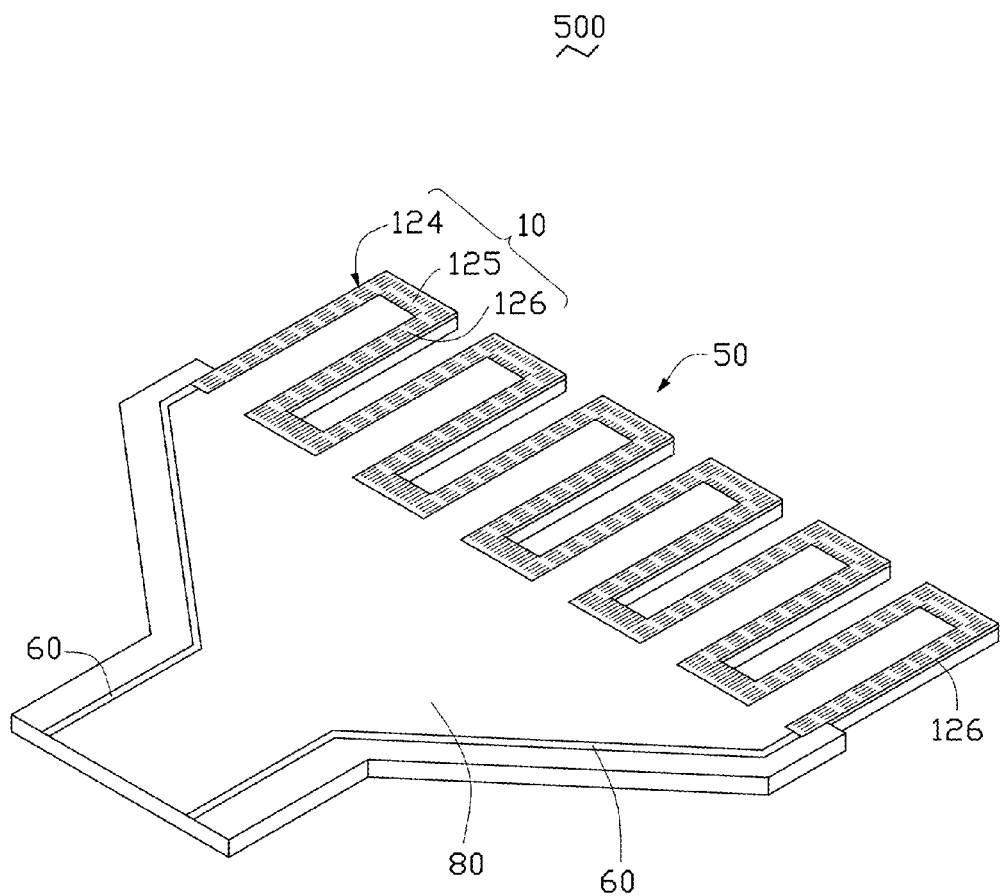
FIG. 16 is an expansion view of the gripper shown in FIG. 15.

FIG. 16 is an expansion view of an embodiment of the gripper 500 shown in FIG. 15. As shown in FIG. 16, the integrated actuator 50 comprises a carbon nanotube film structure 52 and a base. The carbon nanotube film structure 52 comprises a plurality of first electric parts 124, a plurality of second electric parts 126, and a plurality of connection parts 125. The first electric parts 124, the second electric parts 126, and the connection part 125 can be rectangular or stria. The plurality of first electric parts 124 and the plurality of second electric parts 126 are located on the base and interlaced at a set interval. Each of the connection parts 125 located on the base is in contact with one of the first electric parts 124 and one of the corresponding second electric parts 126 to define a conductive circuit. The conduction wires 60 are located on the support 80 and respectively electrically connected to one of the first electric parts 124 and one of the second electric parts 126.

Accordingly, the present disclosure is capable of gripping different components and materials due to at least one conductive circuit formed by a carbon nanotube film structure. In addition, the present disclosure is further capable of rapidly heating a base and a carbon nanotube film structure due to the better electric conductivity and heat conductivity. Thus, a gripper can be easily manufactured and can be safely operated.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

What is claimed is:

1. A gripper, comprising:
a support; and
a plurality of gripping arms fixed on the support,
wherein one gripping arm of the plurality of gripping arms comprises a carbon nanotube film structure that receives current to actuate the gripper for gripping an object, the support comprises a plurality of supportive arms corresponding to the plurality of gripping arms, each of the plurality of supportive arms comprises a first side and a second side, and the second sides of the plurality of supportive arms are in contact with each other.

2. The gripper as claimed in claim 1, wherein the gripper comprises more than two gripping arms and the support comprises more than two supportive arms, the more than two gripping arms are respectively fixed on first sides of the more than two supportive arms of the support.

3. The gripper as claimed in claim 1, wherein the one of the plurality of gripping arms further comprises a base, and the carbon nanotube film structure is located on the base.

4. The gripper as claimed in claim 3, wherein a thickness ratio of the carbon nanotube film structure to the base is in a range from about 1:5 to about 1:200.

5. The gripper as claimed in claim 3, wherein the base is selected from the group consisting of silicone rubber, polymethyl methacrylate, polyurethane, epoxy resin, poly ethyl acrylate, poly butyl acrylate, polystyrene, polybutadiene, polyacrylonitrile, polyaniline, polypyrrole, polythiophene, and any combination thereof.

6. The gripper as claimed in claim 1, wherein the one of the plurality of gripping arms further comprises a base, and the carbon nanotube film structure is received in the base.

7. The gripper as claimed in claim 1, wherein the gripping arm further comprises a base, the carbon nanotube film structure consists of at least one first electric part, at least one second electric part and at least one connection part, the at least one first electric part and the at least one second electric part are located on the base at a set interval, and the at least one connection part is located on the base and in contact with the at least one first electric part and the at least one second electric part to define a conductive circuit.

8. The gripper as claimed in claim 7, wherein the one of the plurality of gripping arms further comprises a conductive layer adjoining the at least one connection part to enhance conductivity of the conductive circuit.

9. The gripper as claimed in claim 8, wherein the conductive layer is composed of silver colloid.

10. The gripper as claimed in claim 7, wherein the carbon nanotube film structure comprises a carbon nanotube film or a plurality of laminated carbon nanotube films.

11. The gripper as claimed in claim 10, wherein the carbon nanotube film of the carbon nanotube film structure comprises a plurality of carbon nanotubes oriented along a direction.

12. The gripper as claimed in claim 1, wherein the gripper comprises two gripping arms and the support comprises two supportive arms, the two gripping arms are respectively fixed on first sides of the two supportive arms of the support.

13. The gripper as claimed in claim 12, wherein the support is assembled as a Y-type support.

14. A gripper, comprising:
a support; and
a plurality of gripping arms fixed on the support, one of the plurality of gripping arms comprising:
a base; and
a carbon nanotube film structure comprising a plurality of first electric parts, a plurality of second electric parts, and at least one connection part,
wherein the plurality of first electric parts and the plurality of second electric parts are located on the base and interlaced at a set interval, and the at least one connection part is located on the base and in contact with the plurality of first electric parts and the plurality of second electric parts to define a conductive circuit that receives current to actuate the gripper for gripping an object.

15. The gripper as claimed in claim 14, wherein the support comprises a plurality of supportive arms corresponding to the plurality of gripping arms, each of the plurality of supportive arms comprises a first side and a second side, and the second sides of the plurality of supportive arms are in contact with each other.

16. The gripper as claimed in claim 15, wherein the gripper comprises more than two gripping arms and the support comprises more than two supportive arms, the more than two gripping arms are respectively fixed on first sides of the more than two supportive arms of the support.

17. The gripper as claimed in claim 15, wherein the gripper comprises two gripping arms and the support comprises two supportive arms, the two gripping arms are respectively fixed on first sides of the two supportive arms of the support.

18. The gripper as claimed in claim 17, wherein the support is assembled as a Y-type support.

19. The gripper as claimed in claim 14, wherein the base is selected from the group consisting of silicone rubber, polymethyl methacrylate, polyurethane, epoxy resin, poly ethyl acrylate, poly butyl acrylate, polystyrene, polybutadiene, polyacrylonitrile, polyaniline, polypyrrole, polythiophene, and any combination thereof.

20. A gripper, comprising:
a support; and
a plurality of gripping arms fixed on the support,
wherein at least one gripping arm of the plurality of gripping arms comprises a carbon nanotube film structure, the carbon nanotube structure being configured to receive electrical currents and to actuate the gripper for gripping an object, the carbon nanotube film structure comprising a plurality of carbon nanotubes arranged along an alignment direction or arranged randomly aligned.

21. The gripper as claimed in claim 20, wherein the plurality of carbon nanotubes are aligned along the alignment direction and are joined end to end along the alignment direction by van der Waals force therebetween.

22. The gripper as claimed in claim 20, wherein an angle between an alignment direction of the plurality of carbon nanotubes and a surface of the carbon nanotube film structure is in a range from about 0 degrees to about 15 degrees.

* * * * *